US007557598B2

(12) United States Patent
Ochiai et al.

(10) Patent No.: US 7,557,598 B2
(45) Date of Patent: Jul. 7, 2009

(54) METHOD OF INSPECTING QUIESCENT POWER SUPPLY CURRENT IN SEMICONDUCTOR INTEGRATED CIRCUIT AND DEVICE FOR EXECUTING THE METHOD

(75) Inventors: Yuetsu Ochiai, Kanagawa (JP); Kentaro Yamamoto, Kanagawa (JP)

(73) Assignee: Panasonic Corporation, Osaka (JP)

( * ) Notice: Subject to any disclaimer, the term of this patent is extended or adjusted under 35 U.S.C. 154(b) by 196 days.

(21) Appl. No.: 11/715,439

(22) Filed: Mar. 8, 2007

(65) Prior Publication Data
US 2007/0210824 A1 Sep. 13, 2007

(30) Foreign Application Priority Data
Mar. 9, 2006 (JP) ............................. 2006-064501

(51) Int. Cl.
G01R 31/02 (2006.01)
G01R 31/26 (2006.01)
G01R 31/08 (2006.01)

(52) U.S. Cl. ..................... 324/765; 324/763; 324/522

(58) Field of Classification Search ................ 324/765, 324/763, 522
See application file for complete search history.

(56) References Cited

U.S. PATENT DOCUMENTS

| 5,944,847 | A | 8/1999 | Sanada |
| 6,140,832 | A | 10/2000 | Vu et al. |
| 6,314,332 | B1 | 11/2001 | Kida |
| 6,678,623 | B2 * | 1/2004 | Koyama ................. 702/82 |
| 6,889,164 | B2 * | 5/2005 | Okuda ................... 702/183 |

FOREIGN PATENT DOCUMENTS

| JP | 01-282478 | 11/1989 |
| JP | 10-082833 | 3/1998 |
| JP | 11-023659 | 1/1999 |
| JP | 2000-206174 | 7/2000 |
| JP | 2000-241492 A | 9/2000 |
| JP | 2002-286802 | 10/2002 |

OTHER PUBLICATIONS

English Translation of Japanese Office Action issued in Japanese Patent Application No. JP 2006-064501, dated Feb. 17, 2009.
Japanese Notification of Reason for Refusal, w/English translation thereof, issued in Japanese Patent Application No. JP 2006-064501 dated Apr. 14, 2009.

* cited by examiner

*Primary Examiner*—Amy He
(74) *Attorney, Agent, or Firm*—McDermott Will & Emery LLP

(57) ABSTRACT

A method of inspecting a quiescent power supply current in a semiconductor integrated circuit, includes an ID information acquisition process for acquiring ID information of the semiconductor integrated circuit, a quiescent power supply current measuring process for measuring the value of the quiescent power supply current in the semiconductor integrated circuit, a measurement information storing process for storing the quiescent power supply current value and the ID information in a corresponding manner, a reference value determining process for determining a reference value for the quiescent power supply current on the basis of the stored quiescent power supply current value, and a defect determining process for comparing the stored quiescent power supply current value with the reference value for the quiescent power supply current to determine whether the semiconductor integrated circuit is defective or not.

8 Claims, 9 Drawing Sheets

FIG. 3

| i   | ID INFORMATION OF SEMICONDUCTOR INTEGRATED CIRCUIT n   | QUIESCENT POWER SUPPLY CURRENT VALUE OF SEMICONDUCTOR INTEGRATED CIRCUIT n   |
|-----|--------------------------------------------------------|------------------------------------------------------------------------------|
| i+1 | ID INFORMATION OF SEMICONDUCTOR INTEGRATED CIRCUIT n+1 | QUIESCENT POWER SUPPLY CURRENT VALUE OF SEMICONDUCTOR INTEGRATED CIRCUIT n+1 |
| i+2 | ID INFORMATION OF SEMICONDUCTOR INTEGRATED CIRCUIT n+2 | QUIESCENT POWER SUPPLY CURRENT VALUE OF SEMICONDUCTOR INTEGRATED CIRCUIT n+2 |
| i+3 | ID INFORMATION OF SEMICONDUCTOR INTEGRATED CIRCUIT n+3 | QUIESCENT POWER SUPPLY CURRENT VALUE OF SEMICONDUCTOR INTEGRATED CIRCUIT n+3 |
| i+4 | ID INFORMATION OF SEMICONDUCTOR INTEGRATED CIRCUIT n+4 | QUIESCENT POWER SUPPLY CURRENT VALUE OF SEMICONDUCTOR INTEGRATED CIRCUIT n+4 |
| i+j | ID INFORMATION OF SEMICONDUCTOR INTEGRATED CIRCUIT n+j | QUIESCENT POWER SUPPLY CURRENT VALUE OF SEMICONDUCTOR INTEGRATED CIRCUIT n+j |

FIG. 4

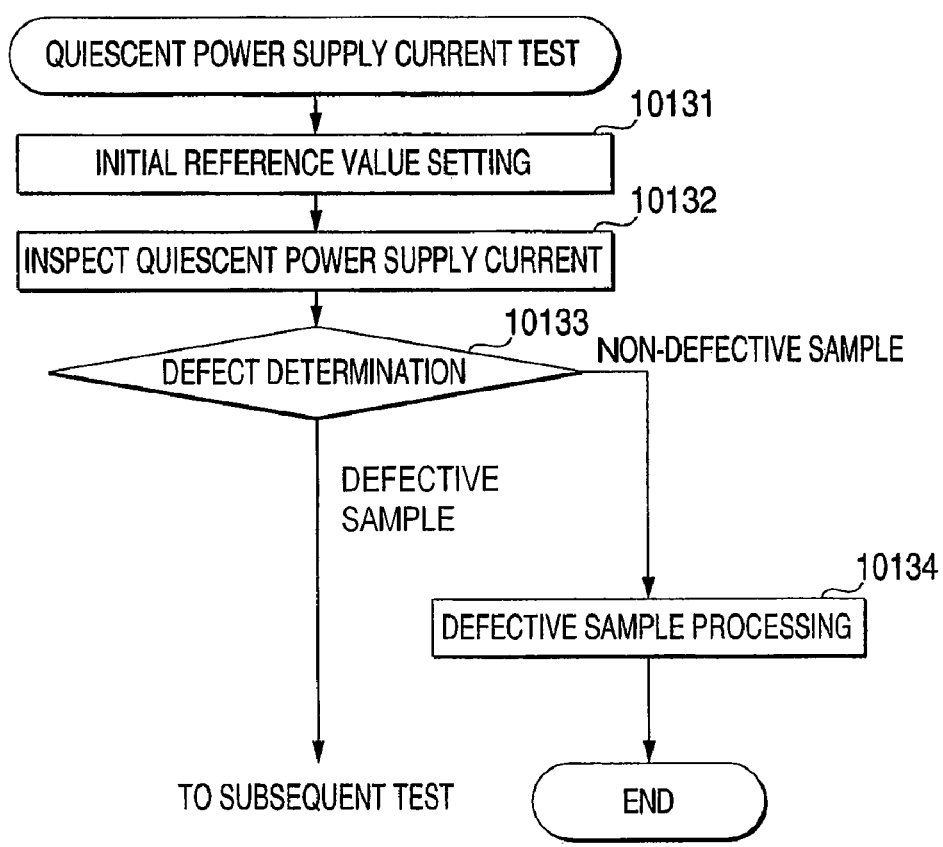

FIG. 6

| | ID INFORMATION OF SEMICONDUCTOR INTEGRATED CIRCUIT | QUIESCENT POWER SUPPLY CURRENT VALUE OF SEMICONDUCTOR INTEGRATED CIRCUIT UNDER INSPECTION CONDITION 1 | QUIESCENT POWER SUPPLY CURRENT VALUE OF SEMICONDUCTOR INTEGRATED CIRCUIT 2 UNDER INSPECTION CONDITION |
|---|---|---|---|
| i | ID INFORMATION OF SEMICONDUCTOR INTEGRATED CIRCUIT n | QUIESCENT POWER SUPPLY CURRENT VALUE OF SEMICONDUCTOR INTEGRATED CIRCUIT n UNDER INSPECTION CONDITION 1 | QUIESCENT POWER SUPPLY CURRENT VALUE OF SEMICONDUCTOR INTEGRATED CIRCUIT n UNDER INSPECTION CONDITION 2 |
| i+1 | ID INFORMATION OF SEMICONDUCTOR INTEGRATED CIRCUIT n+1 | QUIESCENT POWER SUPPLY CURRENT VALUE OF SEMICONDUCTOR INTEGRATED CIRCUIT n+1 UNDER INSPECTION CONDITION 1 | QUIESCENT POWER SUPPLY CURRENT VALUE OF SEMICONDUCTOR INTEGRATED CIRCUIT n+1 UNDER INSPECTION CONDITION 2 |
| i+2 | ID INFORMATION OF SEMICONDUCTOR INTEGRATED CIRCUIT n+2 | QUIESCENT POWER SUPPLY CURRENT VALUE OF SEMICONDUCTOR INTEGRATED CIRCUIT n+2 UNDER INSPECTION CONDITION 1 | QUIESCENT POWER SUPPLY CURRENT VALUE OF SEMICONDUCTOR INTEGRATED CIRCUIT n+2 UNDER INSPECTION CONDITION 2 |
| i+3 | ID INFORMATION OF SEMICONDUCTOR INTEGRATED CIRCUIT n+3 | QUIESCENT POWER SUPPLY CURRENT VALUE OF SEMICONDUCTOR INTEGRATED CIRCUIT n+3 UNDER INSPECTION CONDITION 1 | QUIESCENT POWER SUPPLY CURRENT VALUE OF SEMICONDUCTOR INTEGRATED CIRCUIT n+3 UNDER INSPECTION CONDITION 2 |
| i+4 | ID INFORMATION OF SEMICONDUCTOR INTEGRATED CIRCUIT n+4 | QUIESCENT POWER SUPPLY CURRENT VALUE OF SEMICONDUCTOR INTEGRATED CIRCUIT n+4 UNDER INSPECTION CONDITION 1 | QUIESCENT POWER SUPPLY CURRENT VALUE OF SEMICONDUCTOR INTEGRATED CIRCUIT n+4 UNDER INSPECTION CONDITION 2 |
| ... | | | |
| i+j | ID INFORMATION OF SEMICONDUCTOR INTEGRATED CIRCUIT n+j | QUIESCENT POWER SUPPLY CURRENT VALUE OF SEMICONDUCTOR INTEGRATED CIRCUIT n+j UNDER INSPECTION CONDITION 1 | QUIESCENT POWER SUPPLY CURRENT VALUE OF SEMICONDUCTOR INTEGRATED CIRCUIT n+j UNDER INSPECTION CONDITION 2 |

METHOD OF INSPECTING QUIESCENT POWER SUPPLY CURRENT IN SEMICONDUCTOR INTEGRATED CIRCUIT AND DEVICE FOR EXECUTING THE METHOD

BACKGROUND OF THE INVENTION

The present invention relates to a method of inspecting a quiescent power supply current in a semiconductor integrated circuit, and more particularly, to a method of determining a reference value for the quiescent power supply current.

As an example of an inspection method of the semiconductor integrated circuit, in particular of a CMOS circuit, a quiescent power supply current inspection is generally executed in which a defect determination is made on the basis of an ideal power supply current value for an internal circuit in a quiescent state thereof by utilizing the fact that scarcely little power supply current flows through the internal circuit in the quiescent state (see JP-A-2000-241492, for reference).

As an example of a known method of inspecting the quiescent power supply current, there is a method in which respective values of the quiescent power supply current is measured at each point of a plurality of nodes in the internal circuit to detect any abnormal quiescent power supply current value measured at each point, thereby making the defect determination on the basis of the detection. In this case, the reference value for the quiescent power supply current used for the defect determination is determined in consideration of discrepancy in the manufacturing process or on the basis of the respective values of the quiescent power supply current for defective and non-defective samples.

However, according to the method of inspecting the quiescent power supply current known in the art, since the reference value for the quiescent power supply current is determined in consideration of the discrepancy of the manufacturing process, it is necessary to loosely set the reference value for the quiescent power supply current used for the defect determination.

FIG. 13 is a diagram showing the distribution of the quiescent power supply current in the semiconductor integrated circuit. In FIG. 13, IddqA denotes a reference value for the quiescent power supply current determined in a conventional manner. The quiescent power supply current shows a number of distribution curves A, B, or C, due to the discrepancy in the manufacturing process, as shown in FIG. 13. Since a sample is determined to be defective only when its quiescent power supply current value exceeds the reference value IddqA, the samples corresponding to the portion (indicated by "X" in the figure) of the distribution curve B are also determined to be non-defective. However, the samples corresponding to the X portion should have been determined to be defective.

When the reference value is determined on the basis of the respective values of the quiescent power supply current for defective and non-defective samples in accordance with the known method, it is necessary to classify samples into the defective samples and the non-defective samples in advance.

SUMMARY OF THE INVENTION

The invention has been made in view of the problems described above, and its object is to provide a technique for a quiescent power supply current inspection in a semiconductor integrated circuit, which enables to set a reference value for the quiescent power supply current more tightly than the case of existing technique, thereby improving the inspection quality.

In order to solve the problem, a method of inspecting a quiescent power supply current in a semiconductor integrated circuit in accordance with an aspect of the invention includes an ID information acquisition process for acquiring ID information of the semiconductor integrated circuit; a quiescent power supply current measuring process for measuring the value of the quiescent power supply current in the semiconductor integrated circuit; a measurement information storing process for storing the quiescent power supply current value and the ID information in a corresponding manner; a reference value determining process for determining a reference value for the quiescent power supply current on the basis of the stored quiescent power supply current value; and a defect determining process for comparing the stored quiescent power supply current value with the reference value for the quiescent power supply current to determine whether the semiconductor integrated circuit is defective or not.

According to the arrangement described above, the reference value for the quiescent power supply current can be determined, for example, for each lot of the manufacturing process on the basis of an extent of difference in the respective quiescent power supply current for the lots. Accordingly, it is possible to set the reference value for the quiescent power supply current more tightly than the conventional value which is determined in consideration of the discrepancy of the manufacturing process. Moreover, the reference value for the quiescent power supply current can be determined accurately without a need to classify samples into the defective samples and the non-defective samples in advance.

In the method of inspecting a quiescent power supply current in a semiconductor integrated circuit according to the aspect of the invention, the method includes an initial reference value setting process for setting an initial reference value for the quiescent power supply current before the execution of the inspection; and a preliminary defect determining process for comparing the quiescent power supply current value measured in the quiescent power supply current measuring process with the initial reference value for the quiescent power supply current to determine whether the semiconductor integrated circuit is defective or not. The reference value determining process determines the reference value for the quiescent power supply current on the basis of the stored quiescent power supply current value only for the semiconductor integrated circuit which is determined as non-defective in the preliminary defect determining process.

According to the arrangement described above, the reference value for the quiescent power supply current can be determined on the basis of the distribution of the quiescent power supply current only for the samples which are determined to be non-defective in the preliminary defect determining process. Accordingly, it is possible to determine the reference value for the quiescent power supply current more accurately.

In the method of inspecting a quiescent power supply current in a semiconductor integrated circuit according to the aspect of the invention, the reference value determining process determines the reference value for the quiescent power supply current on the basis of an average and a standard deviation of the stored quiescent power supply current value.

According to the arrangement described above, it is possible to accurately determine the reference value for the quiescent power supply current on the basis of statistical data for the distribution of the quiescent power supply current.

In the method of inspecting a quiescent power supply current in a semiconductor integrated circuit according to the aspect of the invention, the series of processes are executed under different inspection conditions, and the determination on whether the semiconductor integrated circuit is defective or not is made by comparing respective quiescent power supply current values obtained under the different inspection conditions with each other.

According to the arrangement described above, it is possible to detect an abnormal semiconductor integrated circuit by comparing the respective quiescent power supply current values obtained in each of a wafer inspection and a packaged product inspection executed under different temperature conditions with each other.

In the method of inspecting a quiescent power supply current in a semiconductor integrated circuit according to the aspect of the invention, the ID information is used to identify a diffusion lot and a wafer of the semiconductor integrated circuit and coordinate information of the semiconductor integrated circuit on the wafer.

According to the arrangement described above, in the case of wafer inspection, it is possible to create a map of the quiescent power supply current for each wafer at the end of the inspection for the entire semiconductor integrated circuits and classify those semiconductor integrated circuits having their coordinates on the wafer showing a distrustful quality as a defective sample.

In the method of inspecting a quiescent power supply current in a semiconductor integrated circuit according to the aspect of the invention, the ID information is used to identify an assembly lot and a tray number for the semiconductor integrated circuit and coordinate information of the semiconductor integrated circuit placed on the tray.

According to the arrangement described above, in the case of packaged product inspection, it is possible to analyze an assembly lot and a tray number of those samples found to be defective at the end of the inspection for the entire semiconductor integrated circuits and classify those semiconductor integrated circuits having their assembly lots and tray numbers showing a distrustful quality as a defective sample.

In the method of inspecting a quiescent power supply current in a semiconductor integrated circuit according to the aspect of the invention, defect determination information is produced on the basis of the ID information of the semiconductor integrated circuit which is determined to be defective in the defect determining process, the defect determination information is transmitted to a probe or a handler, and the probe or the handler changes its determination information to indicative of defect on the basis of the transmitted defect determination information on the semiconductor integrated circuit which is determined as defective.

In the method of inspecting a quiescent power supply current in a semiconductor integrated circuit in accordance with the invention, the reference value for the quiescent power supply current can be determined for each lot of the manufacturing process on the basis of an extent of difference in the respective quiescent power supply current for the lots. Accordingly, it is possible to set the reference value for the quiescent power supply current more tightly than the conventional value which is determined in consideration of the discrepancy of the manufacturing process, thereby improving the inspection quality. Moreover, the reference value for the quiescent power supply current can be accurately determined without a need to classify samples into the defective samples and the non-defective samples in advance.

In addition, since the reference value for the quiescent power supply current is determined on the basis of the distribution of the quiescent power supply current only for the samples which is determined to be non-defective in the preliminary defect determining process, it is possible to determine the reference value for the quiescent power supply current more accurately.

In addition, since the respective quiescent power supply current values obtained under the different inspection conditions are compared with each other, it is possible to detect those semiconductor integrated circuits showing an unusual change in their quiescent power supply current values.

In addition, since the ID information includes a diffusion lot and a wafer of the semiconductor integrated circuit and coordinate information of the semiconductor integrated circuit on the wafer, it is possible to select those semiconductor integrated circuits located at a specific region of the wafer on the basis of the distribution of defective and non-defective samples on the wafer.

BRIEF DESCRIPTION OF THE DRAWINGS

The above objects and advantages of the present invention will become more apparent by describing in detail preferred exemplary embodiments thereof with reference to the accompanying drawings, wherein:

FIG. 3 is a diagram showing the configuration of data stored in the memory in the method of inspecting a quiescent power supply current in a semiconductor integrated circuit in accordance with the first embodiment;

FIG. 4 is a flowchart showing details of a quiescent power supply current test in the method of inspecting a quiescent power supply current in a semiconductor integrated circuit in accordance with a second embodiment of the invention;

FIG. 6 is a diagram showing the configuration of data stored in the memory in the method of inspecting a quiescent power supply current in a semiconductor integrated circuit in accordance with the third embodiment;

DETAILED DESCRIPTION OF THE PREFERRED EMBODIMENTS

Hereinafter, embodiments of the invention will be described with reference to accompanying drawings.

First Embodiment

Figure 1:
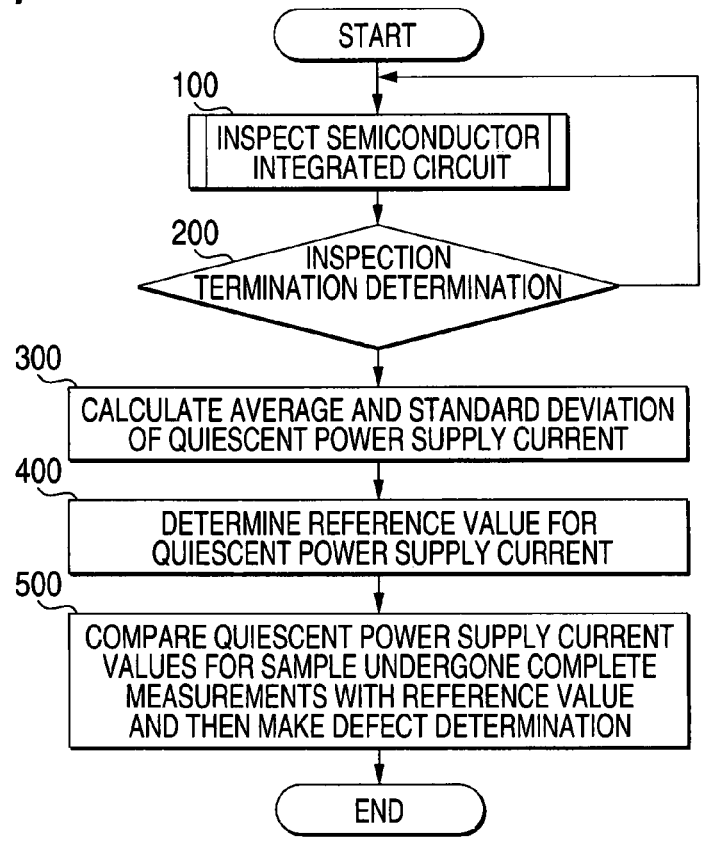
FIG. 1 is a flowchart showing a method of inspecting a quiescent power supply current in a semiconductor integrated circuit in accordance with a first embodiment of the invention.

FIG. 1 is a flowchart showing a method of inspecting a quiescent power supply current in a semiconductor integrated circuit in accordance with a first embodiment of the invention. In FIG. 1, reference numeral 100 denotes a semiconductor integrated circuit inspection process; reference numeral 200 denotes an inspection termination determining process; reference numeral 300 denotes a process for calculating an average and a standard deviation of the quiescent power supply current; reference numeral 400 denotes a process for determining a new reference value for the quiescent power supply current; and reference numeral 500 denotes a defect determining process.

Figure 2:
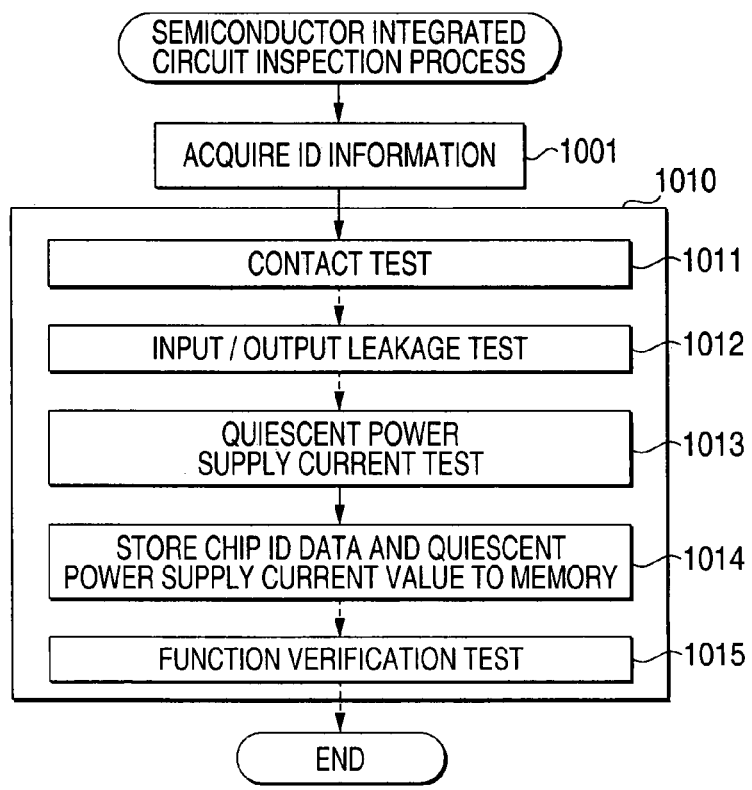
FIG. 2 is a flowchart showing details of the inspection process in the method of inspecting a quiescent power supply current in a semiconductor integrated circuit in accordance with the first embodiment.

FIG. 2 is a flowchart showing details of the semiconductor integrated circuit inspection process 100. In FIG. 2, reference numeral 1001 denotes a process for acquiring unique ID information of the semiconductor integrated circuit; reference numeral 1010 denotes a conventional semiconductor integrated circuit inspection process. The inspection process 1010 includes a variety of test operations such as a contact test 1011, an input/output leakage test 1012, a quiescent power supply current test 1013, a function verification test 1015.

In the present embodiment, a process 1014 for storing in a memory, the ID information of the semiconductor integrated circuit and the value of the quiescent power supply current is included after the quiescent power supply current test 1013 as a unique process in the method of inspecting a quiescent power supply current in a semiconductor integrated circuit in accordance with the invention.

Figure 8:
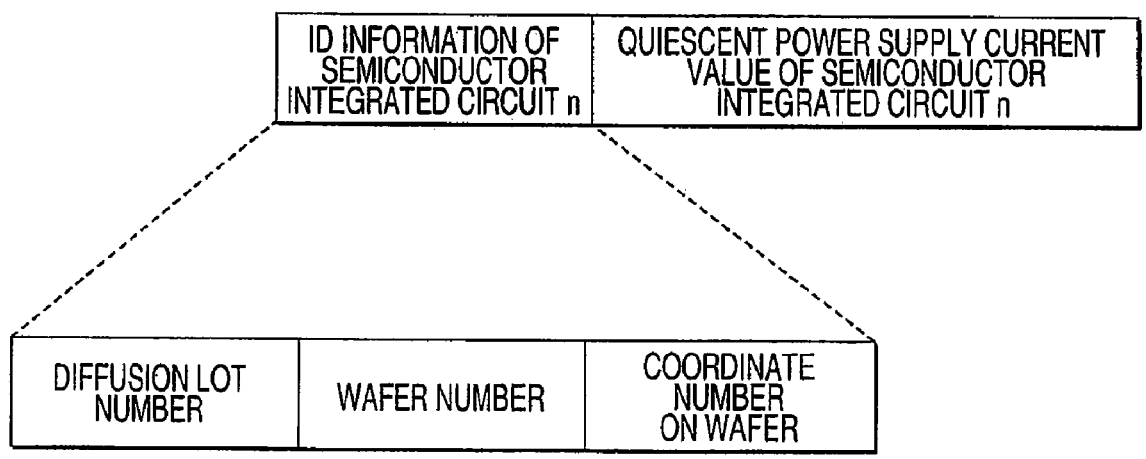
FIG. 8 is a diagram showing an example of the configuration of the ID information used in the method of inspecting a quiescent power supply current in a semiconductor integrated circuit in accordance with the invention.

Although the ID information of the semiconductor integrated circuit is not particularly limited to specific data, other data such as a serial number may be used as the ID information as long as the data can be used to identify individual semiconductor integrated circuits. In the case of wafer inspection, the ID information of the semiconductor integrated circuit may include a diffusion lot number, a wafer number, a coordinate number on the wafer, for example, as shown in FIG. 8. The respective values of the quiescent power supply current in the entire semiconductor integrated circuits are stored with such a data configuration.

Hereinafter, the method of inspecting a quiescent power supply current in a semiconductor integrated circuit in accordance with the present embodiment having such an arrangement will be described with reference to an inspection flow thereof. First, in the semiconductor integrated circuit inspection process 100, the ID information of the semiconductor integrated circuit is read in the ID information acquisition process 1001.

Next, in the inspection process 1010, the conventional semiconductor integrated circuit inspection process such as the contact test 1011 or the input/output test 1012 is performed. Moreover, the quiescent power supply current test 1013 is performed and the test result is stored in the process 1014 together with the ID information. FIG. 3 is a diagram showing the configuration of data stored in the memory.

In the process 200, it is determined whether the above-described processes are performed on the entire semiconductor integrated circuits. When the inspection for the entire semiconductor integrated circuits is completed, an average and a standard deviation of the quiescent power supply current values stored in the memory are calculated in the process 300.

In the process 400, a new reference value for the quiescent power supply current is determined on the basis of the calculation result in the process 300. In the process 500, a defect determination is made by comparing the respective values of the quiescent power supply current in the semiconductor integrated circuits having undergone the inspection with the initial reference value determined in the previous process.

For example, in the case of the wafer inspection, when the ID information has such a configuration as shown in FIG. 8, it is possible to create a map of the quiescent power supply current for each wafer at the end of the inspection for the entire semiconductor integrated circuits and make the defect determination in consideration of the characteristic of the wafer map.

Figure 9:
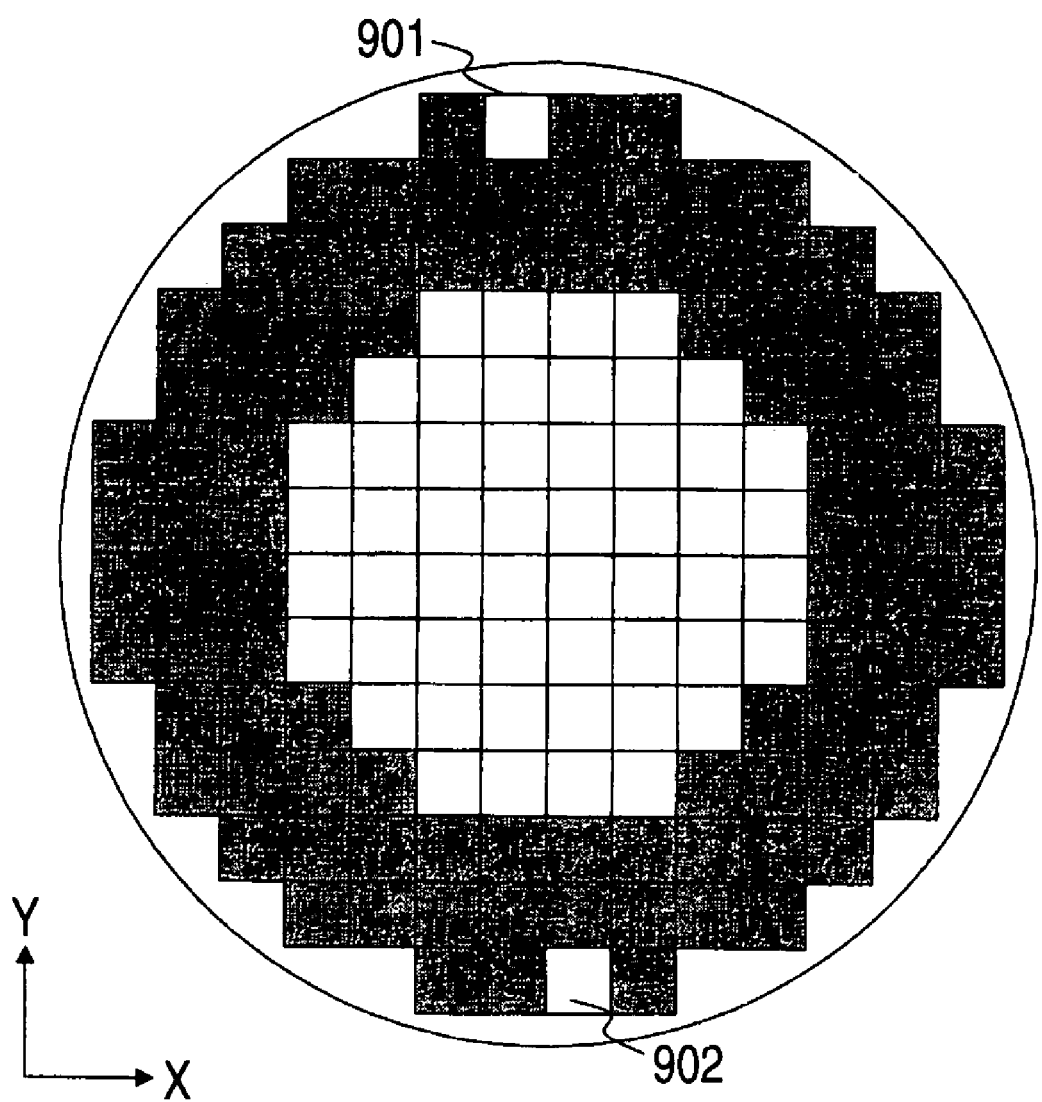
FIG. 9 is a diagram showing an example of a wafer map of the quiescent power supply current in a wafer inspection.

FIG. 9 is a diagram showing an example of the wafer map of the quiescent power supply current in the case of the wafer inspection. For example, when the result of a defect determination made on the basis of the quiescent power supply current value for a piece of wafer shows a distribution of defective and non-defective samples on the wafer in which the semiconductor integrated circuits in the central portion thereof (white portions in FIG. 9) are classified as a non-defective sample and the semiconductor integrated circuits in the peripheral portion thereof (dark portions in FIG. 9) are classified as a defective sample, even those semiconductor integrated circuits 901 and 902 in the peripheral portion which have been determined to be non-defective are also classified as the defective sample.

In this way, by adopting the diffusion lot number, the wafer number, the coordinate number on the wafer as the ID information, it is possible to classify those semiconductor integrated circuits having their coordinates on the wafer showing a distrustful quality as a defective sample.

The ID information of the semiconductor integrated circuit is not limited to those configuration for the case of the wafer inspection as shown in FIG. 8. However, in the case of packaged product inspection, the ID information may include other data such as an assembly lot number, the number of a tray for receiving a packaged product therein, or the coordinate number of the tray so that they are used for the classification of the packaged products.

As described above, according to the present embodiment, the average and the standard deviation of the quiescent power supply current are calculated, for example, for each lot of the manufacturing process, and a modified reference value for the quiescent power supply current is determined on the basis of an extent of difference in the respective quiescent power supply current for the lots. Accordingly, it is possible to set the reference value for the quiescent power supply current more tightly than the conventional value.

In addition, the defect determination on the semiconductor integrated circuits having undergone the inspection is made on the basis of the modified reference value for the quiescent power supply current, and the defective and non-defective samples are classified on the basis of the ID information. Accordingly, the inspection can be performed on the basis of an accurate reference value for the quiescent power supply current without a need to classify samples into the defective samples and the non-defective samples in advance.

Second Embodiment

FIG. 4 is a flowchart showing details of a quiescent power supply current test in the method of inspecting a quiescent power supply current in a semiconductor integrated circuit in accordance with a second embodiment of the invention. That is, an initial reference value setting process, a defect determining process, and a defective sample processing process are further added to the quiescent power supply current test 1013 of the first embodiment.

In FIG. 4, reference numeral 10131 denotes a process for setting the initial reference value in consideration of discrepancy in the manufacturing process; reference numeral 10132 denotes a quiescent power supply current inspection process; reference numeral 10133 denotes a defect determining process based on the initial reference value; and reference numeral 10134 denotes a defective sample processing process.

In the method of inspecting a quiescent power supply current in a semiconductor integrated circuit in accordance with the present embodiment having such an arrangement, the basic inspection flow is the same as those shown in FIGS. 1 and 2. With the addition of those processes shown in FIG. 4 to the quiescent power supply current test 1013, the average and the standard deviation are calculated in the process 300 only for those quiescent power supply currents excluding those for the defective samples, and a new reference value for the quiescent power supply current is determined in the process 400.

As described above, according to the present embodiment, a modified reference value for the quiescent power supply current is determined on the basis of the distribution of the quiescent power supply current only for the non-defective samples which are determined on the basis of the initial reference value. Accordingly, it is possible to determine the reference value for the quiescent power supply current more accurately.

Third Embodiment

Figure 5:
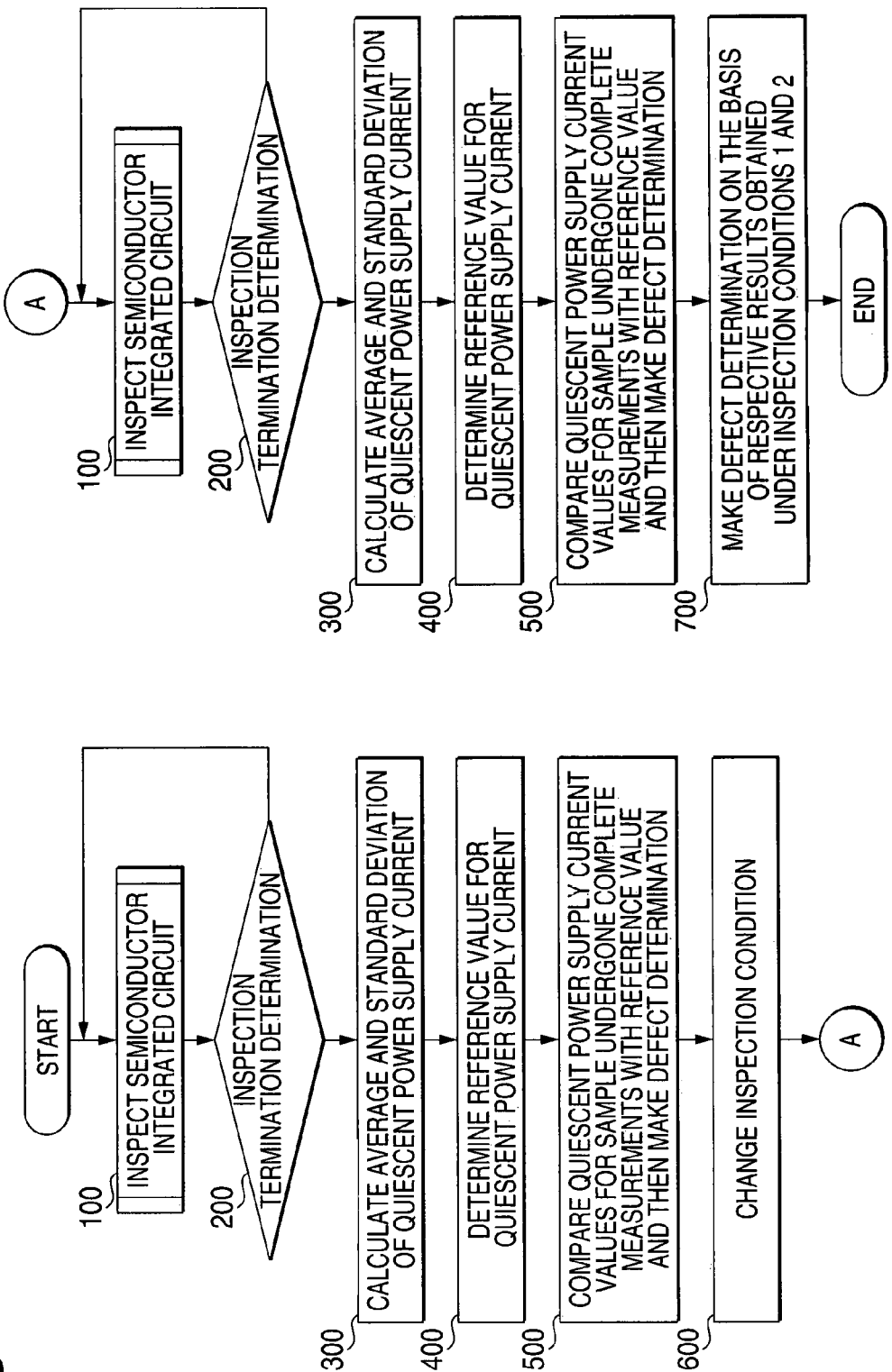
FIG. 5 is a flowchart showing a method of inspecting a quiescent power supply current in a semiconductor integrated circuit in accordance with a third embodiment of the invention.

FIG. 5 is a flowchart showing a method of inspecting a quiescent power supply current in a semiconductor integrated circuit in accordance with a third embodiment of the invention. In the present embodiment, a process 600 for changing the inspection condition is performed after the inspection flow in the first embodiment so that the inspection in the first embodiment is performed again under a different inspection condition, and, thereafter, a defect determining process 700 is performed to detect those semiconductor integrated circuits showing an unusual change from the inspection results obtained under inspection conditions 1 and 2.

In the method of inspecting a quiescent power supply current in a semiconductor integrated circuit in accordance with the present embodiment having such an arrangement, the entire semiconductor integrated circuits are first inspected under the inspection condition 1 in a similar manner to the case of the first embodiment. For example, the inspection condition 1 is the wafer inspection.

Next, respective settings corresponding to the inspection condition 2 are changed in the process 600 for changing the inspection condition. For example, the inspection condition 2 is the packaged product inspection. In the case of the wafer inspection and the packaged product inspection, the inspection is performed under different inspection temperatures, in general. Therefore, inspection specifications for the temperature are changed in the inspection condition 2. Thereafter, the inspection is performed under the inspection condition 2 in a similar manner to the case of the first embodiment.

Figure 7:
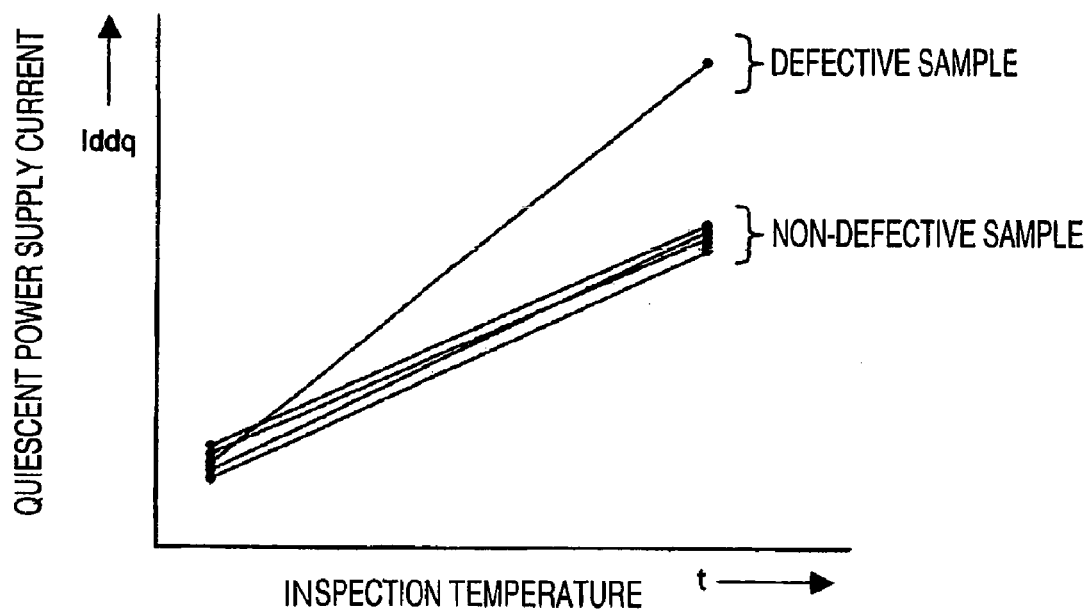
FIG. 7 is a characteristic diagram of the quiescent power supply current in the semiconductor integrated circuit under different inspection conditions.

As a result of the above-described inspection, respective information on the quiescent power supply current for the inspection conditions 1 and 2 is stored in the memory together with the ID information, as shown in FIG. 6. Then, in the process 700, the slope of the quiescent power supply current with respect to the temperature variation under the inspection conditions 1 and 2 is calculated and classification of defective and non-defective samples are performed. As shown in FIG. 7, those semiconductor integrated circuits showing an abnormal slope are determined to be defective.

As described above, according to the present embodiment, it is possible to detect an abnormal semiconductor integrated circuit by comparing the respective quiescent power supply current values obtained under different inspection conditions with each other.

Fourth Embodiment

Figure 10:
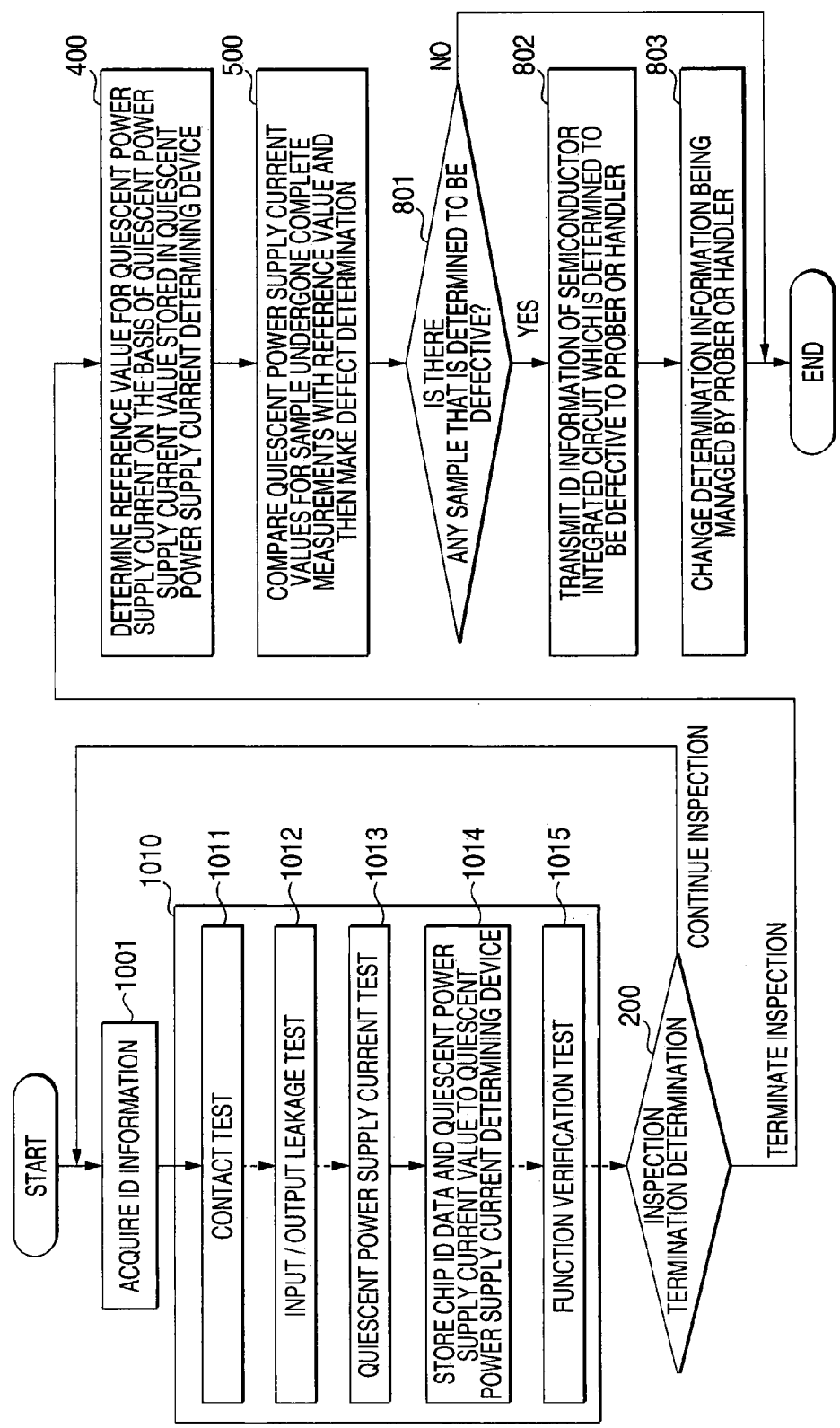
FIG. 10 is a flowchart showing a method of inspecting a quiescent power supply current in a semiconductor integrated circuit in accordance with a fourth embodiment of the invention.

FIG. 10 is a flowchart showing a method of inspecting a quiescent power supply current in a semiconductor integrated circuit in accordance with a fourth embodiment of the invention. In the present embodiment, a process for changing determination information stored in a probe or a handler on the basis of the result of the defect determination made on the semiconductor integrated circuits is performed after the inspection flow in the first embodiment.

In FIG. 10, the inspection flow ranging from the process 1001 for acquiring unique ID information of the semiconductor integrated circuit to the defect determining process 500 is the same as that described in connection with the first embodiment. Reference numeral 801 denotes a process for determining whether there is any semiconductor integrated circuit that is determined to be defective; reference numeral 802 denotes a process for transmitting ID information of those semiconductor integrated circuits that is determined to be defective; and reference numeral 803 denotes a process for changing determination information stored in the probe or the handler.

In the method of inspecting a quiescent power supply current in a semiconductor integrated circuit in accordance with the present embodiment having such an arrangement, the basic inspection flow is the same as that described in connection with the first embodiment. In the process 801, it is determined whether there is any semiconductor integrated circuit that is determined to be defective or not, on the basis of the comparison result in the process 500 obtained by comparing the respective values of the quiescent power supply current with the reference value. In the process 802, the ID information of those semiconductor integrated circuits that is determined to be defective is transmitted to the probe or the handler. Then, the determination information stored in the probe or the handler is changed in the process 803 in accordance with the transmitted ID information, and the semiconductor integrated circuits corresponding to the ID information are determined to be defective.

Figure 11:
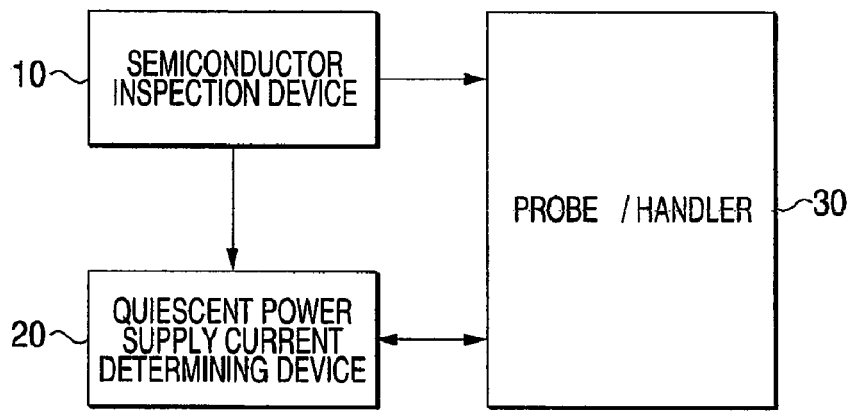
FIG. 11 is a diagram showing an example of the arrangement of an inspection device for inspecting the quiescent power supply current in the semiconductor integrated circuit.

FIG. 11 is a diagram showing an example of the arrangement of an inspection device for executing the quiescent power supply current inspection in accordance with the present embodiment. In FIG. 11, reference numeral 10 denotes a semiconductor inspection device for inspecting the semiconductor integrated circuit; reference numeral 20 denotes a quiescent power supply current determining device for executing the inspection method in accordance with the invention; and reference numeral 30 denotes the probe for executing the wafer inspection or the handler for executing the packaged product inspection.

In the inspection device having such an arrangement, the quiescent power supply current determining device 20 acquires the unique ID information of the semiconductor integrated circuit from the probe or the handler 30 and then the semiconductor inspection device 10 executes the inspection. In this case, the values of the quiescent power supply current are output from the semiconductor inspection device 10 to the quiescent power supply current determining device 20 and then stored in the memory of the quiescent power supply current determining device 20 together with the ID information.

When the inspection for the entire semiconductor integrated circuits to be inspected is completed, the quiescent power supply current determining device 20 calculates an average and a standard deviation of the quiescent power supply current and determine a modified reference for the quiescent power supply current. Next, the modified reference for the quiescent power supply current is compared with the respective values of the quiescent power supply current for the samples having undergone the inspection, and the defect determination is made. The result of the defect determination is transmitted from the quiescent power supply current determining device 20 to the probe or the handler 30, and the determination information stored in the probe or the handler 30 is changed.

Figure 12:
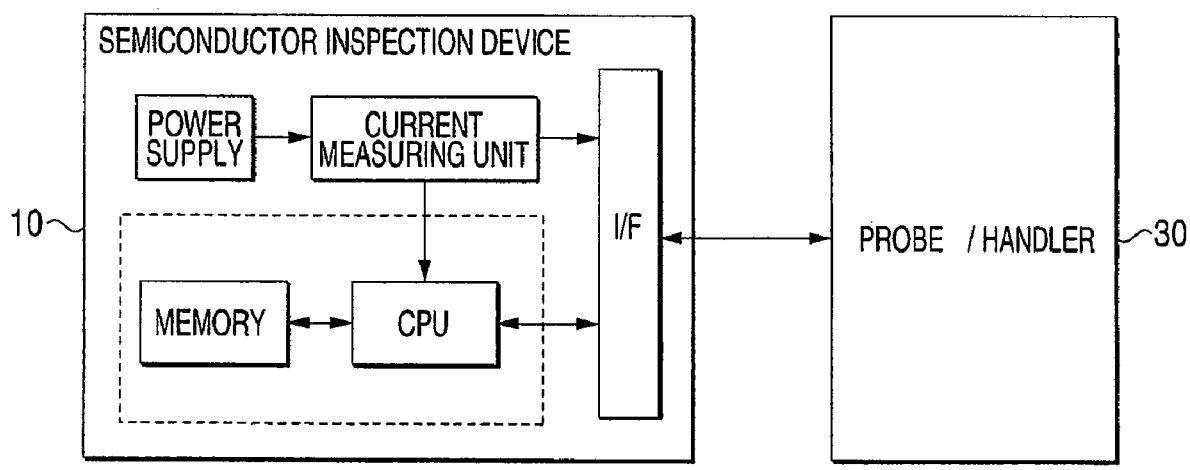
FIG. 12 is a diagram showing an example of the arrangement of the case in which the quiescent power supply current measuring device is embodied in the semiconductor inspection device.
Figure 13:
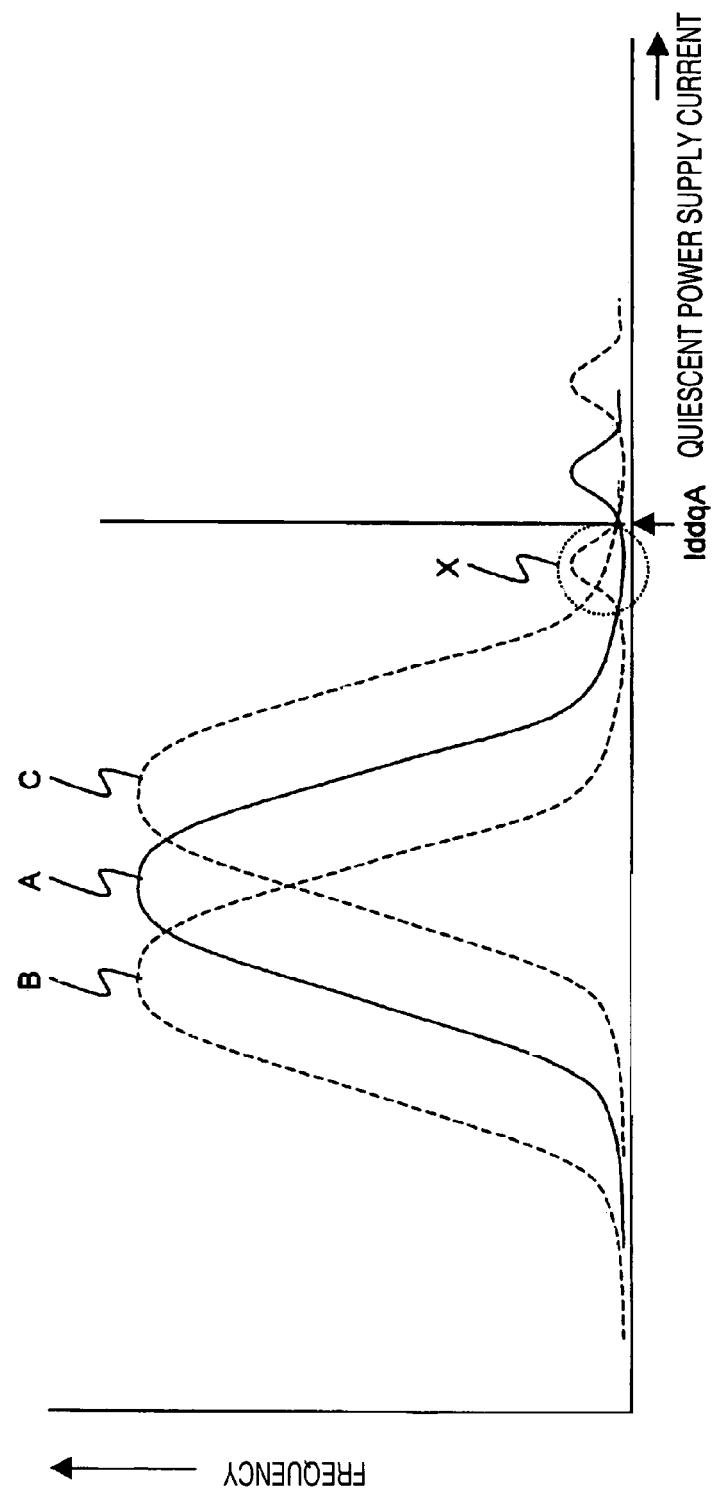
FIG. 13 is a diagram showing the distribution of the quiescent power supply current in the semiconductor integrated circuit.

In the above-described inspection device, the function of the quiescent power supply current determining device 20 may be embodied in the semiconductor inspection device 10. FIG. 12 is a diagram showing an example of the arrangement of the case in which the quiescent power supply current measuring device of the semiconductor inspection device is configured to incorporate therein a CPU, a memory, an electric current measuring function of a general semiconductor inspection device.

As described above, according to the present embodiment, it is possible to transmit the result of the defect determination on the semiconductor integrated circuit to the probe or the handler and change the determination information stored in the probe and the handler. In addition, the arrangement shown in FIGS. 11 and 12 is shown as a generalized example and thus may be applied to the first to third embodiments as well.

According to the method and device for inspecting a quiescent power supply current in a semiconductor integrated circuit in accordance with the invention, since the reference value for the quiescent power supply current can be set more tightly and it is possible to detect those semiconductor integrated circuits showing an unusual change under different inspection conditions or those semiconductor integrated circuits located at a portion on the wafer showing a distrustful quality, it is effective in improving the inspection quality for semiconductor integrated circuits.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No. 2006-064501 filed on Mar. 9, 2006, the contents of which are incorporated herein by reference.

What is claimed is:

1. A method of inspecting a quiescent power supply current in a semiconductor integrated circuit, the method comprising:
   (a) an ID information acquisition process for acquiring ID information of one of a plurality of semiconductor integrated circuits;
   (b) a quiescent power supply current measuring process for measuring a quiescent power supply current value of the quiescent power supply current in the one of the plurality of semiconductor integrated circuits;
   (c) a measurement information storing process for storing the quiescent power supply current value and the ID information in corresponding pairs;
   (d) repeating the processes (a) through (c) for storing a plurality of measured quiescent power supply current values for the plurality of semiconductor integrated circuits;
   (e) a reference value determining process for determining a reference value on the basis of the plurality of measured quiescent power supply current values stored in the memory; and
   (f) a defect determining process, by comparing a stored quiescent power supply current value with the reference value, for determining whether the semiconductor integrated circuit is defective or not.

2. The method of inspecting a quiescent power supply current in a semiconductor integrated circuit according to claim 1, further comprising:
   (g) an initial reference value setting process for setting an initial reference value for the quiescent power supply current; and
   (h) a preliminary defect determining process, by comparing a quiescent power supply current value measured in the quiescent power supply current measuring process with the initial reference value, for determining whether the semiconductor integrated circuit is defective or not, wherein, in the reference value determining process, the reference value is determined on the basis of measured quiescent power supply current values for the semiconductor integrated circuits which are determined as non-defective in the preliminary defect determining process.

3. The method of inspecting a quiescent power supply current in a semiconductor integrated circuit according to claim 1, wherein, in the reference value determining process, the reference value is determined on the basis of an average and a standard deviation of the plurality of measured quiescent power supply current values stored in the memory.

4. The method of inspecting a quiescent power supply current in a semiconductor integrated circuit according to claim 1, wherein the series of processes are executed under different inspection conditions; and
   wherein the determination on whether the semiconductor integrated circuit is defective or not is made by comparing respective quiescent power supply current values obtained under the different inspection conditions with each other.

5. The method of inspecting a quiescent power supply current in a semiconductor integrated circuit according to claim 1, wherein the ID information is used to identify a diffusion lot, a wafer of the semiconductor integrated circuit and coordinate information of the semiconductor integrated circuit on the wafer.

6. The method of inspecting a quiescent power supply current in a semiconductor integrated circuit according to claim 1, wherein the ID information is used to identify an assembly lot, a tray number for the semiconductor integrated circuit and coordinate information of the semiconductor integrated circuit placed on the tray.

7. The method of inspecting a quiescent power supply current in a semiconductor integrated circuit according to claim 1,
   wherein defect determination information is produced on the basis of the ID information of the semiconductor integrated circuit which is determined as defective in the defect determining process;

wherein the defect determination information is transmitted to a probe or a handler; and wherein the probe or the handler changes its determination information to indicative of defect on the basis of the transmitted defect determination information on the semiconductor integrated circuit which is determined as defective.

8. A device for inspecting a quiescent power supply current in a semiconductor integrated circuit, the device comprising measuring unit and a memory, the measuring unit being configured to:

(a) acquire ID information of one of a plurality of semiconductor integrated circuits;

(b) measure a quiescent power supply current value of the quiescent power supply current in the one of the plurality of semiconductor integrated circuits;

(c) store the quiescent power supply current value and the ID information in corresponding pairs into the memory;

(d) repeat (a) through (c) for storing a plurality of measured quiescent power supply current values for the plurality of semiconductor integrated circuits;

(e) determine a reference value on the basis of the plurality of measured quiescent power supply current values stored in the memory; and (f) determine whether the semiconductor integrated circuit is defective or not by comparing a stored quiescent power supply current value with the reference value.

* * * * *